(12) United States Patent
Wang

(10) Patent No.: US 7,485,912 B2
(45) Date of Patent: Feb. 3, 2009

(54) FLEXIBLE METAL-OXIDE-METAL CAPACITOR DESIGN

(75) Inventor: Chien-Jung Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 30 days.

(21) Appl. No.: 11/391,064

(22) Filed: Mar. 28, 2006

(65) Prior Publication Data

US 2007/0235838 A1 Oct. 11, 2007

(51) Int. Cl.
*H01L 27/108* (2006.01)
*H01L 29/94* (2006.01)

(52) U.S. Cl. ............... 257/307; 257/306; 257/532; 257/E27.048; 438/399

(58) Field of Classification Search ......... 257/532, 257/534, E27.048, E21.008, 307, 306; 438/255, 438/398, 399
See application file for complete search history.

(56) References Cited

U.S. PATENT DOCUMENTS

| | | | |
|---|---|---|---|
| 5,208,725 A * | 5/1993 | Akcasu | 361/313 |
| 6,117,747 A | 9/2000 | Shao et al. | |
| 6,222,528 B1 * | 4/2001 | Gerpheide et al. | 345/173 |
| 6,570,210 B1 * | 5/2003 | Sowlati et al. | 257/307 |
| 6,656,850 B2 | 12/2003 | Molloy et al. | |
| 6,680,542 B1 | 1/2004 | Gibson et al. | |
| 6,913,992 B2 * | 7/2005 | Schmitt et al. | 438/628 |
| 7,071,599 B2 * | 7/2006 | Namerikawa et al. | 310/366 |
| 2006/0094204 A1 * | 5/2006 | Isono | 438/437 |
| 2006/0220080 A1 * | 10/2006 | Dubin et al. | 257/295 |
| 2006/0220251 A1 * | 10/2006 | Kloster et al. | 257/758 |
| 2006/0249776 A1 * | 11/2006 | Manning et al. | 257/307 |

FOREIGN PATENT DOCUMENTS

JP 09046012 * 2/1997 ................. 257/510

* cited by examiner

*Primary Examiner*—Kenneth Parker
*Assistant Examiner*—John Lin
(74) *Attorney, Agent, or Firm*—Slater & Matsil, L.L.P.

(57) ABSTRACT

A flexible scheme for forming a multi-layer capacitor structure is provided. The multi-layer capacitor structure includes a first electrode and a second electrode extending through at least one metallization layer, wherein the first electrode and the second electrode are separated by dielectric materials. In each of the metallization layers, the first electrode comprises a first bus and first fingers connected to the first bus, wherein the first bus comprises a first leg in a first direction, and wherein the first fingers are parallel to each other and are in a second direction. The first direction and the second direction form an acute angle. In each of the metallization layers, the second electrode comprises a second bus and second fingers connected to the second bus, wherein the second fingers are parallel to the first fingers in a same metallization layer.

21 Claims, 7 Drawing Sheets

FLEXIBLE METAL-OXIDE-METAL CAPACITOR DESIGN

TECHNICAL FIELD

This invention relates generally to semiconductor devices, and more particularly to layout design and manufacturing methods of metal-oxide-metal capacitors.

BACKGROUND

Figure 1:
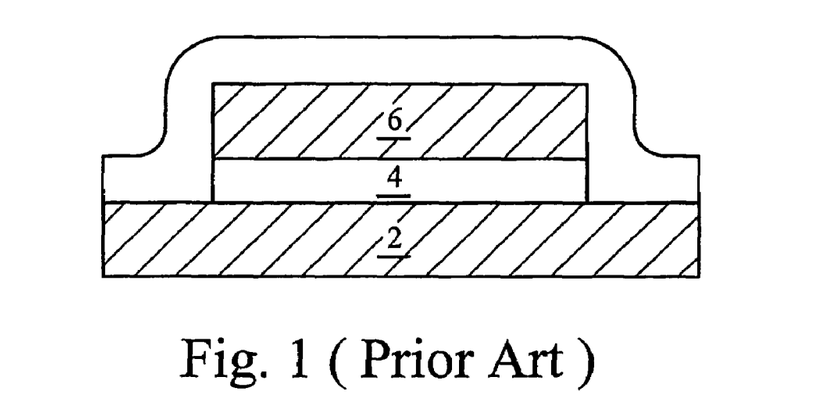
FIG. 1 illustrates a typical metal-oxide-metal capacitor.

Capacitors are widely used in integrated circuits. One of the most commonly used capacitors is the metal-oxide-metal (MOM) capacitor. FIG. 1 illustrates a typical MOM capacitor, which includes a bottom plate 2, a top plate 6, and an insulation layer 4 therebetween. The bottom plate 2 and top plate 6 are formed of conductive materials.

As is known in the art, the capacitance of a MOM capacitor is proportional to its area and the dielectric constant (k) of the insulation layer, and is inversely proportional to the thickness of the insulation layer. Therefore, to increase the capacitance, it is preferable to increase the area and k value and to reduce the thickness of the insulation layer. However, the thickness and k value are often limited by the technology used for forming the capacitor. For example, the thickness cannot be less than what the existing technology allows. On the other hand, since the MOM capacitors are often formed in low-k dielectric layers, the ability to increase the k value is also limited.

Figure 2:
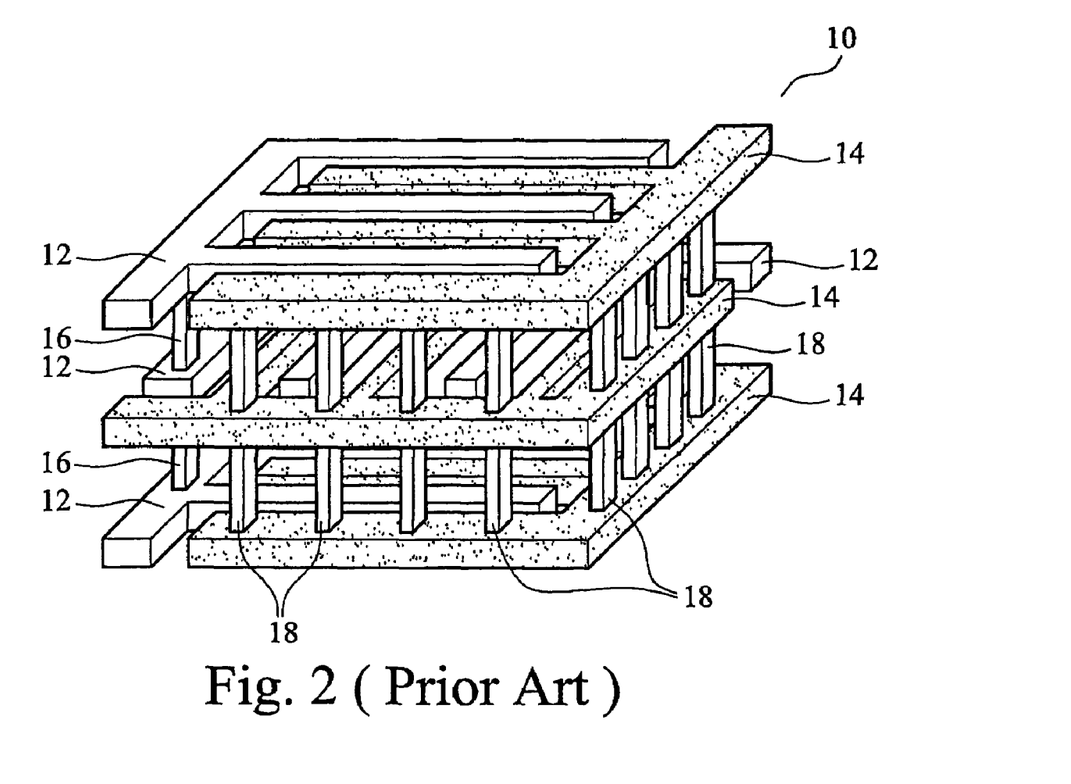
FIG. 2 illustrates a perspective view of a conventional multi-layer metal-oxide-metal capacitor.
Figure 3:
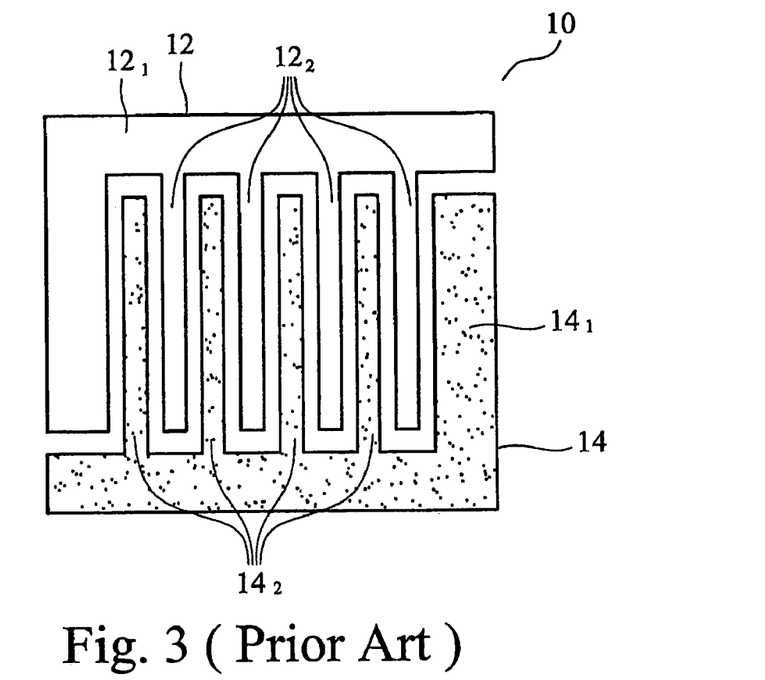
FIGS. 3 and 4 are top views of the multi-layer metal-oxide-metal capacitor shown in FIG. 2.
Figure 4:
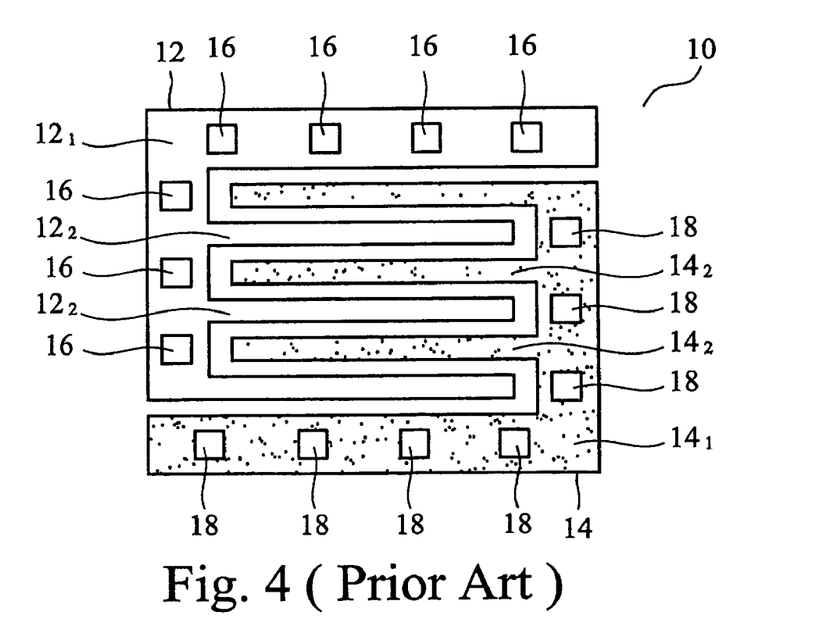

Methods for increasing the area of the capacitor have also been explored. A problem associated with increased area is that greater chip area is required. This dilemma is solved by the introduction of vertical (multi-layer) capacitors. A typical vertical MOM capacitor 10 is shown in FIGS. 2, 3 and 4. FIG. 2 illustrates a perspective view of a capacitor 10, which includes two metal electrodes 12 and 14 separated by dielectric materials. Each of the metal electrodes 12 and 14 form a three-dimensional structure. For clarity, metal electrode 12 is shown as unpatterned, and metal electrode 14 is patterned with dots.

Each of the metal electrodes 12 and 14 include more than one layer connected by vias, and each layer is formed in a metallization layer commonly used for the formation of interconnect structures. FIG. 3 illustrates a top view of a first metal layer (please refer to the middle layer in FIG. 2). Metal electrode 12 includes fingers 12$_2$ and a bus 12$_1$ that connects all the fingers 12$_2$. Metal electrode 14 includes fingers 14$_2$ and a bus 14$_1$ that connects all the fingers 14$_2$. Fingers 12$_2$ and 14$_2$ are placed in an alternating pattern with a very small space between the neighboring fingers. Therefore, each finger 12$_2$/14$_2$ forms a sub capacitor(s) with its neighboring fingers 14$_2$/12$_2$ or a bus 14$_1$/12$_1$. The total capacitance is equivalent to the sum of the sub capacitors.

FIG. 4 illustrates a top view of the capacitor 10 in a second metallization layer (refer to the top or the bottom layer in FIG. 2), which overlies or underlies the first metallization layer. Typically, the direction of the fingers in the second metallization layer is orthogonal to the direction of fingers in the first metallization layer. Similarly, electrodes 12 and 14 in the second metallization layer include buses 12$_1$ and 14$_1$ and a plurality of fingers 12$_2$ and 14$_2$, respectively. Typically, buses 12$_1$ in all the layers have similar shapes and sizes and are overlapped vertically. Buses 14$_1$ in all the layers also have similar shapes and sizes and are overlapped vertically. Vias 16 connect buses 12$_1$ in the first and the second metallization layers, thereby forming an integral electrode 12. Similarly, vias 18 connect buses 14$_1$ in neighboring layers, thereby forming an integral electrode 14.

Figure 5:
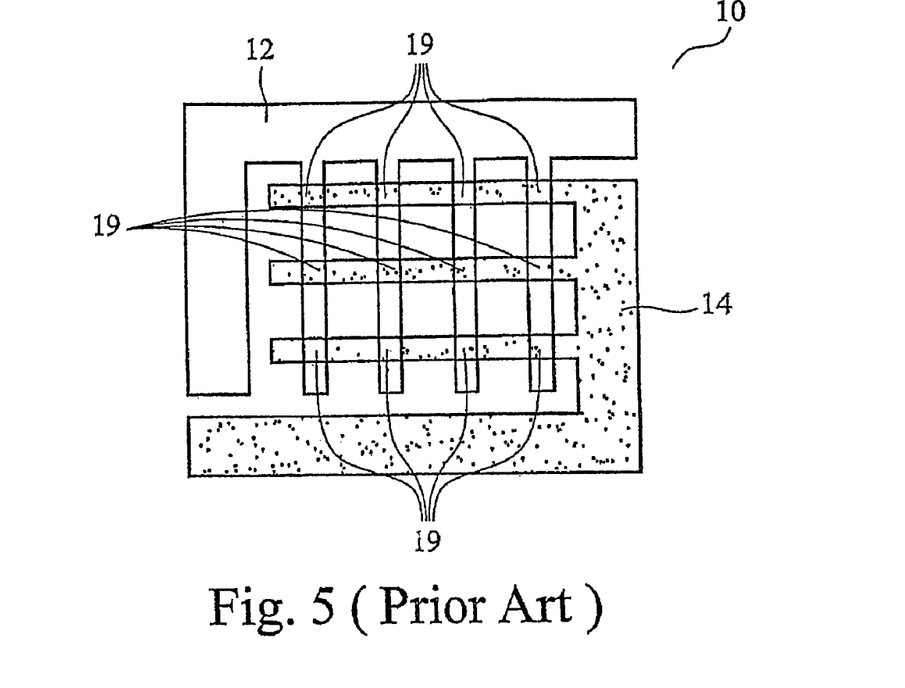
FIG. 5 shows a top view of portions of two neighboring layers of the capacitor shown in FIG. 2, wherein sub capacitors are formed by overlapped regions between neighboring layers.

In addition to the capacitance in each of the metallization layers, the capacitance of capacitor 10 also includes portions created by the overlap between the different layers. FIG. 5 illustrates electrode 12 in the first metallization layer and electrode 14 in the second metallization layer. Note that overlapped portions 19 contribute to the total capacitance of capacitor 10.

In the conventional capacitor shown in FIGS. 2 through 5, fingers 12$_2$ are orthogonal to the connecting bus 12$_1$, and fingers 14$_2$ are orthogonal to the connecting bus 14$_1$. The capacitors having such a structure thus require rectangular-shaped chip areas. If an irregular chip area is available, only a sub area having a rectangular shape can be used to form a capacitor. The chip area usage is thus low. Therefore, a more flexible capacitor design is needed.

SUMMARY OF THE INVENTION

In accordance with one aspect of the present invention, a metal-oxide-metal capacitor structure includes a first bus comprising a first leg in a first direction and a second leg in a second direction, and a second bus electrically insulated from the first bus, wherein the first bus and the second bus are in a first metallization layer. First fingers are parallel to each other and are connected to the first bus. Second fingers are parallel to each other and are connected to the second bus. The first and the second fingers are parallel and are placed in an alternating pattern, separated by a dielectric material. The first and the second fingers are in a third direction wherein the third direction forms an acute angle with at least one of the first direction and the second direction.

In accordance with another aspect of the present invention, the metal-oxide-metal capacitor structure extends into a second metallization layer. The structure of the capacitor in the second metallization layer is similar to the first metallization layer except the fingers in the second metallization layer are in a direction different from the third direction in the first metallization layer.

In accordance with yet another aspect of the present invention, a multi-layer capacitor structure is formed. The multi-layer capacitor structure includes a first electrode and a second electrode extending through more than one metallization layer, wherein the first electrode and the second electrode are separated by dielectric materials. In each of the metallization layers, the first electrode comprises a first bus and first fingers connected to the first bus, wherein the first bus comprises a first leg in a first direction, and wherein the first fingers are parallel to each other and are in a second direction. The first direction and the second direction form an acute angle. In each of the metallization layers, the second electrode comprises a second bus and second fingers connected to the second bus, wherein the second fingers are parallel to the first fingers in a same metallization layer.

The preferred embodiments of the present invention provide a flexible scheme for designing MOM capacitors. The capacitor structure can have a shape conforming to the contour of the available chip area, thus the usage of the chip area is improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the preferred embodiment of the present invention, a metal-oxide-metal (MOM) capacitor having a flexible design is formed. The intermediate stages of manufacturing the MOM capacitor are illustrated. Throughout the various views and illustrative embodiments of the present invention, like reference numbers are used to designate like elements.

Figure 6:
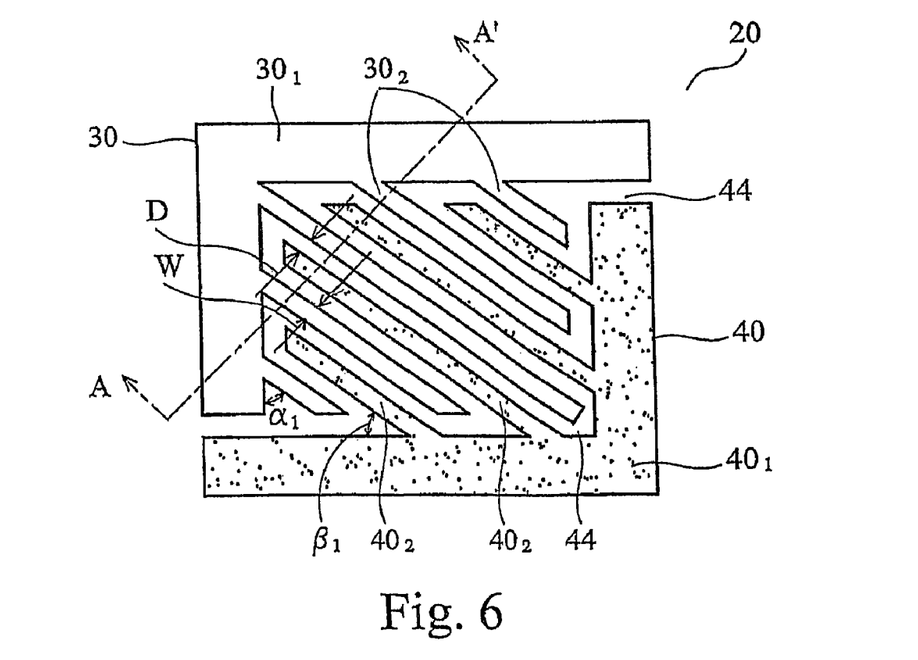
FIGS. 6 and 7 are top views of a preferred embodiment of the present invention.
Figure 7:
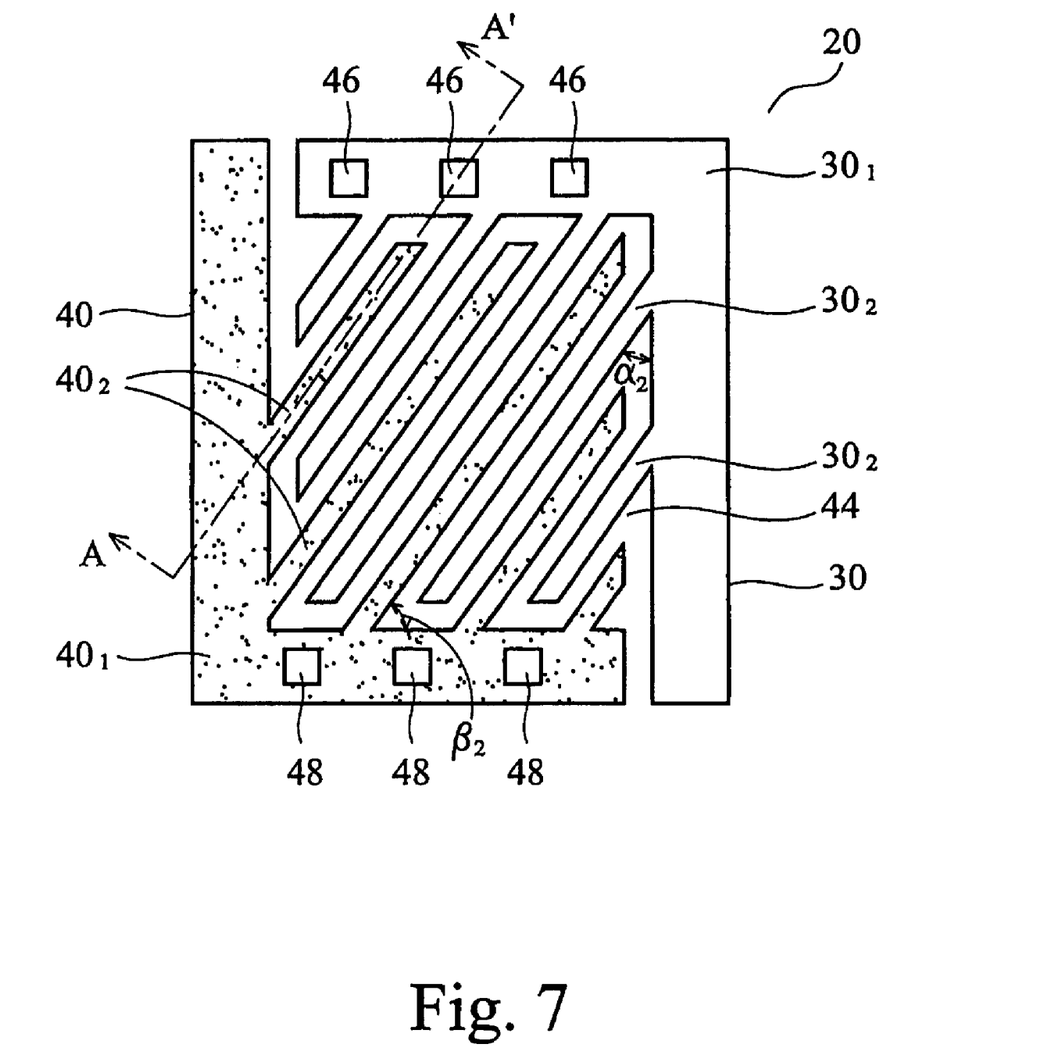

FIGS. 6 and 7 illustrate top views of two neighboring layers of a capacitor 20. Capacitor 20 includes two electrodes, also sometimes referred to as capacitor plates, 30 and 40, wherein the electrode 30 is illustrated with no pattern and no filling, and electrode 40 is patterned with dots, for clarity. Capacitor 20 preferably expands through multiple metallization layers, although it can be formed in only one layer. Accordingly, electrodes 30 and 40 are preferably formed in multiple layers.

FIG. 6 illustrates a top view of a bottom layer (layer 1) of the capacitor 20. In the preferred embodiment, the bottom layer is formed in a metallization layer commonly used for forming interconnect structures. Since the bottom layer can be in any metallization layer, layer 1 of the capacitor 20 is not necessarily the first metallization layer M1, as is commonly referred to in the art.

It is appreciated that electrodes 30 and 40 are preferably, but not necessarily, symmetric features. Therefore, any described characteristics of electrode 30 equally apply to electrode 40, and vice versa.

In layer 1, electrode 30 comprises a bus $30_1$ and fingers $30_2$ connected to bus $30_1$. Electrode 40 comprises a bus $40_1$ and fingers $40_2$, which are interconnected by bus $40_1$. Preferably, fingers $30_2$ and $40_2$ have a width W of about 0.05 µm to about 1000 µm, and more preferably about 200 nm to about 1000 nm. The distance D between the fingers is about 50 nm to about 500 nm, and preferably about 150 nm to about 300 nm. One skilled in the art will realize that the width W is related to the technologies used and will be reduced when the integrated circuits are scaled down.

Fingers $30_2$ and $40_2$ are parallel to each other and placed in an alternating pattern, so that each of the fingers $30_2/40_2$ forms a sub capacitor with the neighboring fingers $40_2/30_2$. As is known in the art, all these sub capacitors are connected in parallel, and the equivalent capacitance is the sum of all sub capacitances. An insulation material 44 fills the vacancy between the neighboring fingers $30_2$ and $40_2$. Preferably the distance D between neighboring fingers $30_2$ and $40_2$ is less than about 0.25 µm.

Insulation material 44 is preferably an inter-metal dielectric material that is used for the isolation of interconnect structures. Therefore, insulation material 44 preferably has a low k value, although a high k value would help increase the capacitance. More preferably, the k value is less than 3.6. The preferred insulation material 44 includes fluorine-doped oxide, carbon-doped silicon oxide, and other materials commonly used in the art.

Fingers $30_2$ and their connecting bus $30_1$ form an angle $\alpha_1$. Similarly, fingers $40_2$ and their connecting bus $40_1$ form an angle $\beta_1$. In the preferred embodiment, $\alpha_1$ and $\beta_1$ are acute angles (between about 0 and about 90 degrees), and more preferably between about 20 degrees and about 70 degrees. Even more preferably, $\alpha_1$ and $\beta_1$ are about 45 degrees.

A top view of the layer 2 of the capacitor 20 is shown in FIG. 7. Similar to layer 1, electrode 30 in layer 2 includes a bus $30_1$ and fingers $30_2$. Preferably, the bus $30_1$ in layer 2 and the bus $30_1$ in layer 1 have as much as overlap as possible, and at least a portion of the bus $30_1$ overlaps the overlying and/or underlying bus $30_1$ so that vias can be formed. Due to layout, it is likely that some portions are not overlapped. In an exemplary embodiment as shown in FIGS. 6 and 7, only the horizontal legs of the buses $30_1$ in neighboring layers overlap, while the vertical legs of the buses $30_1$ in one layer are flipped from one to another in the neighboring layers. In other embodiments where layout is not an issue, the bus $30_1$ in one layer substantially overlaps the bus $30_1$ in the overlying layer and/or the underlying layer.

Fingers $30_2$ in layer 2 form an angle $\alpha_2$ with bus $30_1$. In layer 2, electrode 40 also includes a bus $40_1$ and fingers $40_2$. Similar to electrode 30, the bus $40_1$ in layer 2 and the bus $40_1$ in layer 1 have at least one portion overlapping, and possibly one portion un-overlapped. Fingers $40_2$ form an angle $\beta_2$ with the connecting bus. Angles $\alpha_2$ and $\beta_2$ are preferably acute angles, and more preferably between about 20 degrees and about 70 degrees, and even more preferably about 45 degrees.

Fingers in two neighboring layers are preferably non-parallel due to topographic issues. For example, some portion of the capacitor 20 may easily form recesses during chemical mechanical polish. In the preferred embodiment, the fingers in two neighboring layers (refer to FIGS. 6 and 7) are substantially orthogonal if viewed from the top. In other embodiments, the fingers in two neighboring layers form an angle of between about 20 degrees and about 70 degrees.

As shown in FIG. 7, vias 46 are formed to connect overlapping portions of buses $30_1$ in layers 1 and 2. Portions of electrode 40 in neighboring layers are also connected by vias 48, which connect to the overlapped portion of the buses $40_1$.

As capacitors formed in each layer are connected in parallel, more layers can be formed to increase the total capacitance of the capacitor 20. In the preferred embodiment, the layouts in different layers have an alternating pattern. For example, the top views of layers with odd numbers are similar to the top view of layer 1, and top views of layers with even numbers are similar to the top view of layer 2.

FIGS. 8 through 11 are cross-sectional views of intermediate stages in the formation of the preferred embodiment of the present invention. The cross-sectional views are taken from a plane crossing a line A-A' (refer to FIGS. 6 and 7). Line A-A' is selected so that adequate, but not overwhelming, details for understanding the formation processes are shown. Reference numerals used in FIGS. 6 and 7 are also used in FIGS. 8 through 11 to identify like elements. For simplicity, only the formation of layer 1 and layer 2 are shown.

Figure 8:
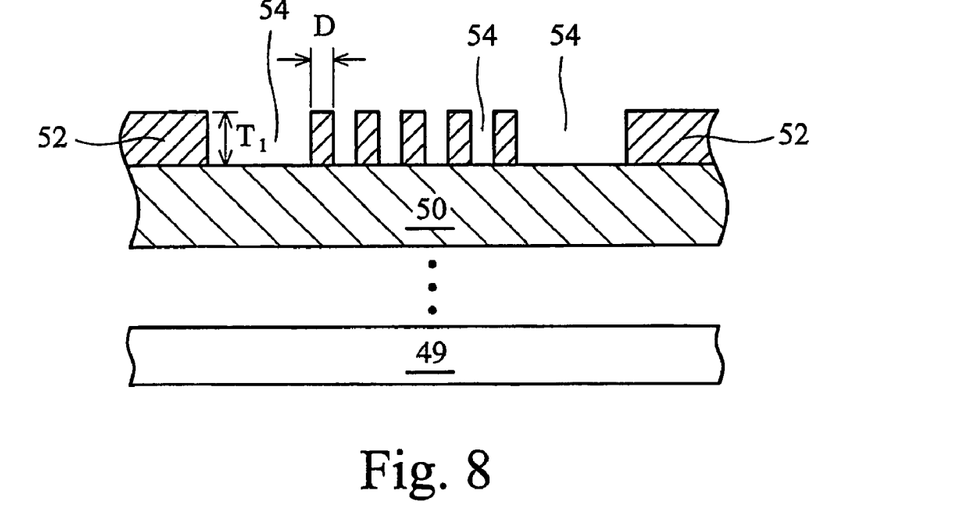
FIGS. 8 through 11 are cross-sectional views of intermediate stages in the manufacture of a capacitor.

Referring to FIG. 8, a dielectric layer 52 is formed on a layer 50 over a substrate 49. Dielectric layer 52 preferably has a thickness $T_1$ of between about 65 nm and about 200 nm. In the preferred embodiment, layer 50 is an inter-layer dielectric layer or an inter-metal dielectric layer. In other embodiments, layer 50 may be a dielectric layer specifically formed for the formation of the respective capacitor. Dielectric layer 52 is patterned to form openings 54. The neighboring openings 54 (forming fingers) are preferably closely spaced, and more preferably are separated by a distance D of less than about 0.25 μm (refer to FIG. 6).

Figure 9:
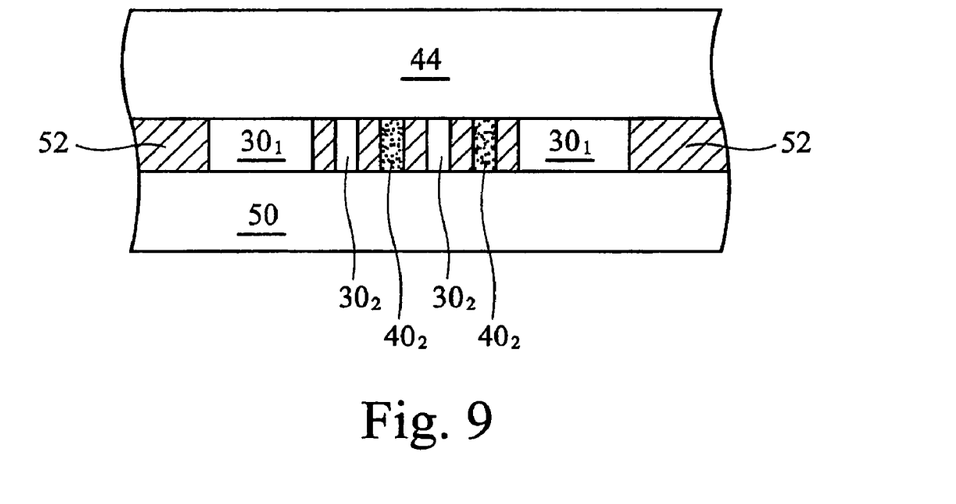

In FIG. 9, the openings 54 are filled with a metallic material, such as copper, aluminum, copper alloy, aluminum alloy, and the like. A chemical mechanical polish is then performed to level the metallic material, leaving metal portions $30_1$, $30_2$, $40_1$ (not shown in this cross-sectional view) and $40_2$. Although metal portions $30_1$, $30_2$, $40_1$ and $40_2$ are illustrated with different patterns, they are preferably simultaneously formed using the same material.

Figure 10:
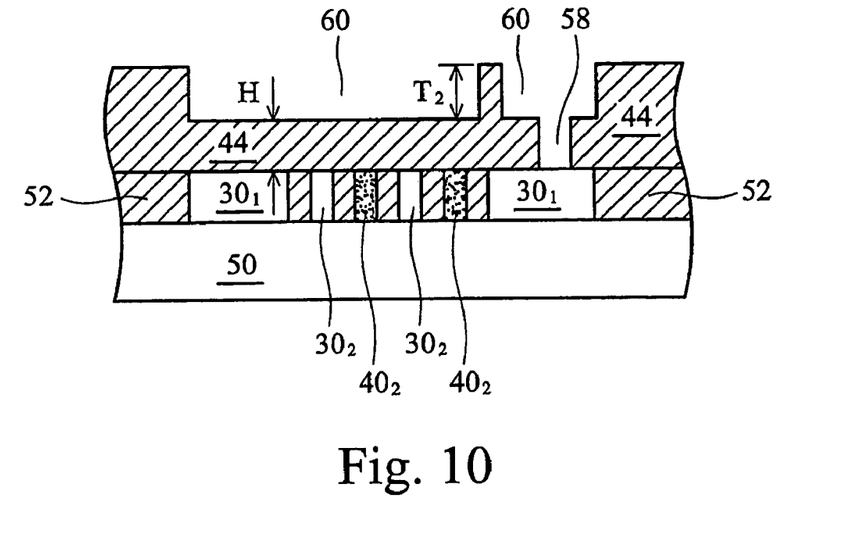

In the preferred embodiment, a dual damascene process is performed to form vias and layer 2 elements. A dielectric layer 44, which preferably has a low-k value, is formed. FIG. 10 illustrates the formation of a via opening 58 and trench openings 60 in the low-k dielectric layer 44. Photo resists (not shown) are formed and patterned over low-k dielectric layer 44. In the preferred embodiment, an anisotropic plasma etch cuts through the low-k dielectric layer 44 and stops at the bus $30_1$, thereby forming a via opening 58. Simultaneously, via openings (not shown) for forming vias connecting bus $40_1$ (not shown) are also formed. Trench openings 60 are then formed and used to form layer 2 elements of the capacitor 20. Since there is no etch stop layer for forming trench openings 60, etching time is controlled so that the etching of the trench openings 60 stops at a desired depth. Since greater depth of the trench openings 60 results in a greater capacitance of the capacitor 20, depth $T_2$ of the trench openings 60 is preferably greater than the height H of the via opening 58. In the preferred embodiment, depth $T_2$ of the trench openings 60 is preferably about 50 nm to about 500 nm, and more preferably about 100 nm to about 300 nm.

In alternative embodiments, a trench-first approach is taken, in which the trench openings 60 are formed prior to the formation of the via opening 58.

Figure 11:
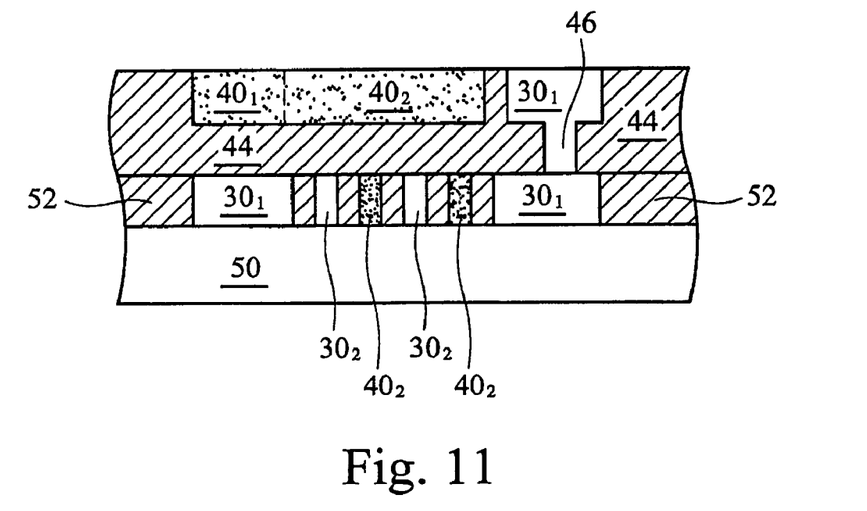

FIG. 11 illustrates the filling of the via opening 58 and trench openings 60. Preferably, a barrier layer (not shown) is formed to prevent copper from diffusing into low-k dielectric layer 44, wherein the barrier layer is preferably formed of a material comprising titanium, titanium nitride, tantalum, tantalum nitride, and the like. Via opening 58 and trench openings 60 are then filled with a conductive material, preferably copper or copper alloys. However, other metals and metal alloys such as aluminum, silver and gold can also be used. A chemical mechanical polish is performed to level the surface, forming the via 46 and bus $40_1$, fingers $40_2$ and bus $30_1$. Fingers $30_2$ and vias 48 (not shown) are also formed simultaneously.

In subsequent process steps, layer 3, layer 4 and other overlying layers can further be formed over and connected to layers 1 and 2 to finish the formation of the capacitor 20.

The previously discussed embodiment uses damascene processes, which are preferred when capacitor 20 comprises copper. One skilled in the art will realize that metal features in each layer of the capacitor 20 can be formed by depositing a conductive material, such as aluminum, tungsten, and the like, and etching to form desired patterns.

Figure 12:
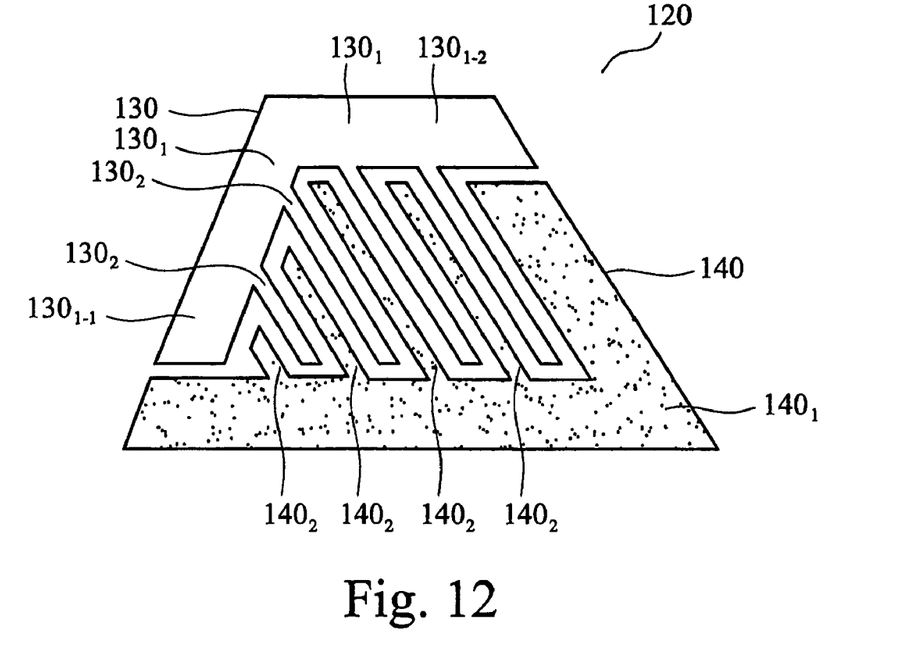
FIGS. 12 and 13 illustrate an application of the preferred embodiment of the present invention.
Figure 13:
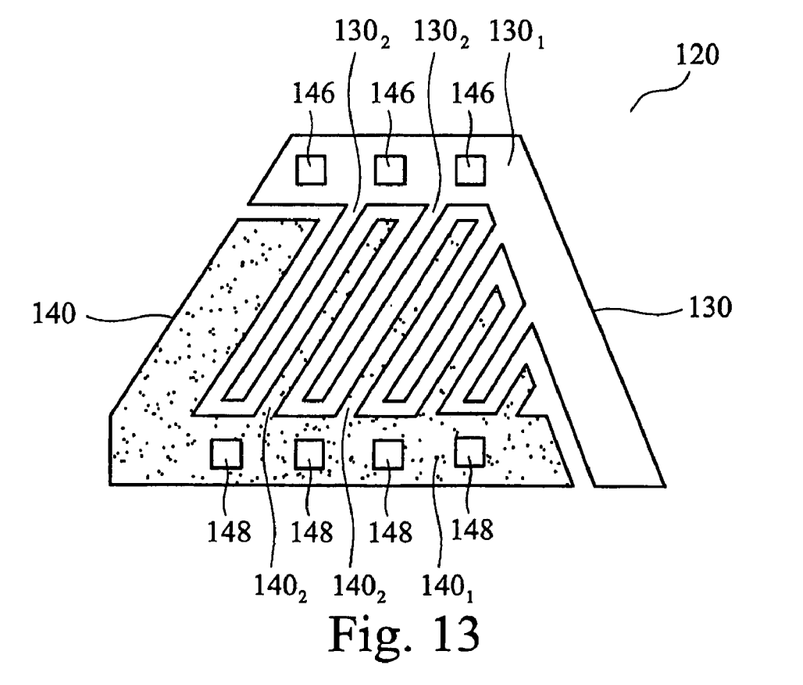

With the flexible design of the preferred embodiments of the present invention, irregular-shaped chip areas can be used efficiently to form MOM capacitors. An exemplary embodiment is shown in FIGS. 12 and 13, wherein a chip area in the shape of a trapezoid is provided for forming a capacitor. If a rectangular MOM capacitor is to be formed in an irregular chip area, the usage of the chip area will be low. However, by using the preferred embodiment of the present invention, a trapezoid-shaped capacitor, which preferably conforms to the contour of the chip area, can be formed.

FIG. 12 illustrates a first layer of a capacitor 120, which comprises a first electrode 130 and a second electrode 140. Since the two legs of the electrode 130 are not perpendicular to each other, if fingers $130_2$ are orthogonal to the leg $130_{1\_1}$ of the bus $130_1$, they will not be orthogonal (or parallel) to the leg $130_{1\_2}$, and vice versa. Therefore, a layout scheme as shown in FIG. 12 can be used to fit the shape of the chip area. Electrode 140 includes a bus $140_1$ and fingers $140_2$. Neighboring fingers $130_2$ and $140_2$ are parallel to form sub capacitors.

FIG. 13 illustrates a second layer overlying or underlying the first layer. For layout convenience, each of the buses $130_1$ and $140_1$ in the second layer has a portion overlapping the respective buses in the first layer, and vias 146 and 148 are formed to connect electrodes 130 and 140, respectively.

Although the top views of the previously discussed embodiments have four sides, one skilled in the art will realize that the present invention can be used on chip areas with three, five or more sides. By changing the contour of the buses, capacitors with other shapes, such as circular or elliptical, can also be formed.

The preferred embodiments of the present invention provide a flexible layout scheme for the formation of MOM capacitors. With higher usage of the available chip area, greater capacitance can be achieved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A capacitor structure comprising:
   a first bus comprising a first leg in a first direction and a second leg in a second direction;
   a second bus electrically insulated from the first bus, wherein the first bus and the second bus are in a first metallization layer;
   first fingers connected to the first bus, wherein the first fingers are parallel to each other and have a longitudinal axis that forms an acute angle with the first leg, and wherein some of the first fingers are connected to the first bus at the first leg and others of the first fingers are connected to the first bus at the second leg; and
   second fingers connected to the second bus, wherein the second fingers are parallel to each other and parallel to the first fingers, and wherein the first fingers and the second fingers are placed in an alternating pattern and separated by a dielectric material;

wherein the first fingers act as a first capacitor plate for the capacitor and the second fingers act as a second capacitor plate for the capacitor.

2. The capacitor structure of claim 1, wherein the first direction and the second direction are orthogonal.

3. The capacitor structure of claim 1, wherein the acute angle is between about 20 degrees and about 70 degrees.

4. The capacitor structure of claim 3, wherein the acute angle is about 45 degrees.

5. The capacitor structure of claim 1, wherein a thickness of the first fingers is about 50 nm to about 500 nm.

6. The capacitor structure of claim 1, wherein a dielectric constant of the dielectric materials is less than about 3.6.

7. The capacitor structure of claim 1, further comprising:
a third bus in a third direction connected to the first bus through first vias, and a fourth bus in a fourth fingers connected to the second bus through second vias, wherein the third and the fourth buses are in a second metallization layer and electrically insulated;
third fingers connected to the third bus, wherein the third fingers are parallel; and
fourth fingers connected to the fourth bus, wherein the fourth fingers are parallel to each other and parallel to the third fingers, and wherein the third fingers and the fourth fingers are placed in an alternating pattern and separated by an additional dielectric material, and wherein the third fingers and the fourth fingers form an additional acute angle with at least one of the third direction and the fourth direction.

8. The capacitor structure of claim 7, wherein the third direction and the fourth direction are orthogonal.

9. The capacitor structure of claim 7, wherein the third direction and the fourth direction are not orthogonal.

10. The capacitor structure of claim 1, wherein a thickness of the first fingers is about 65 nm to about 200 nm.

11. The capacitor structure of claim 1, wherein the second bus comprises a third leg and a fourth leg not orthogonal to each other.

12. The capacitor structure of claim 1, wherein the first direction and the second direction are not orthogonal.

13. A multi-layer capacitor structure comprising:
a first electrode and a second electrode extending through a plurality of metallization layers, wherein the first electrode and the second electrode are separated by dielectric materials;
wherein in each of the metallization layers, the first electrode comprises a first bus and first fingers connected to the first bus, wherein the first bus comprises a first leg in a first direction and a second leg in a second direction, and wherein the first fingers are parallel to each other and are in a third direction, wherein at least one of the first fingers is connected to the first bus at the first leg and others of the first fingers are connected to the first bus at the second leg, the first fingers being otherwise surrounded by the dielectric materials;
wherein the first direction and the third direction form an acute angle; and wherein in each of the metallization layers, the second electrode comprises a second bus and second fingers connected to the second bus, wherein the second fingers are parallel to the first fingers in a same metallization layer.

14. The multi-layer capacitor structure of claim 9, wherein the first fingers in one metallization layer have at least portions overlapped and portions not overlapped with the second fingers in another metallization layer.

15. The multi-layer capacitor structure of claim 13, wherein the acute angle is between about 20 degrees and about 70 degrees.

16. The multi-layer capacitor structure of claim 13, wherein the second leg is orthogonal to the first leg.

17. The multi-layer capacitor structure of claim 13, wherein the second bus comprises a third leg and a fourth leg, and wherein the second fingers form an additional acute angle with at least one of the third leg and the fourth leg, and wherein ones of the second fingers are connected to the second bus at the third leg and others of the second fingers are connected to the second bus at the fourth leg.

18. The multi-layer capacitor structure of claim 13, wherein the dielectric materials for separating the first and the second electrodes have a dielectric constant of less than about 3.6.

19. A capacitor structure comprising:
a first bus comprising a first leg and a second leg;
a second bus comprising a third leg and a fourth leg, the third leg substantially parallel to the first leg and the fourth leg substantially parallel to the second leg;
a set of first fingers extending from the first leg and the second leg towards the second bus, the set of first fingers being substantially parallel to each other; and
a set of second fingers extending from the third leg and fourth leg towards the first bus and being substantially parallel with each other and the set of first fingers, wherein adjacent ones of the set of second fingers are separated by no more than one of the first fingers;
wherein the first fingers comprise one plate of a capacitor and the second fingers comprise a second plate of a capacitor.

20. The capacitor structure of claim 19, further comprising:
a third bus connected to the first bus through first vias;
a fourth bus connected to the second bus through second vias, wherein the third bus and the fourth bus are in a separate metallization layer from the first bus and the second bus, and wherein the third bus and fourth bus are electrically isolated from each other;
a set of third fingers connected to the third bus and extending towards the fourth bus parallel to each other; and
a set of fourth fingers connected to the fourth bus and extending towards the third bus parallel to each other and also parallel to the set of third fingers, wherein adjacent ones of the set of fourth fingers are separated by no more than one of the third fingers.

21. The capacitor structure of claim 20 wherein the set of first fingers have at least portions that overlap the set of fourth fingers.

* * * * *

UNITED STATES PATENT AND TRADEMARK OFFICE
CERTIFICATE OF CORRECTION

PATENT NO.          : 7,485,912 B2                                              Page 1 of 1
APPLICATION NO.  : 11/391064
DATED                  : February 3, 2009
INVENTOR(S)         : Wang It is certified that error appears in the above-identified patent and that said Letters Patent is hereby corrected as shown below:

In Col. 7, line 19, delete "fingers" and insert --direction--.
In Col. 8, line 6, delete "9" and insert --13--.

Signed and Sealed this

Seventh Day of April, 2009

JOHN DOLL
*Acting Director of the United States Patent and Trademark Office*